United States Patent
Martinez et al.

(10) Patent No.: US 10,921,481 B2
(45) Date of Patent: Feb. 16, 2021

(54) NITROGEN-VACANCY-BASED DOWNHOLE SENSING

(71) Applicant: Halliburton Energy Services, Inc., Houston, TX (US)

(72) Inventors: Yenny Natali Martinez, Houston, TX (US); Satyan Gopal Bhongale, Cypress, TX (US); Wolfgang Hartmut Nitsche, Humble, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 214 days.

(21) Appl. No.: 16/097,336

(22) PCT Filed: Dec. 29, 2017

(86) PCT No.: PCT/US2017/068926
§ 371 (c)(1),
(2) Date: Oct. 29, 2018

(87) PCT Pub. No.: WO2019/132973
PCT Pub. Date: Jul. 4, 2019

(65) Prior Publication Data
US 2020/0284941 A1 Sep. 10, 2020

(51) Int. Cl.
*G01V 8/02* (2006.01)
*G01V 8/00* (2006.01)
*E21B 47/06* (2012.01)
*E21B 47/07* (2012.01)
*E21B 47/12* (2012.01)

(52) U.S. Cl.
CPC ............... *G01V 8/02* (2013.01); *E21B 47/06* (2013.01); *E21B 47/07* (2020.05); *E21B 47/12* (2013.01); *G01V 8/005* (2013.01)

(58) Field of Classification Search
CPC .......... E21B 47/06; E21B 47/07; E21B 47/12; G01V 8/02; G01V 8/005
See application file for complete search history.

(56) References Cited

U.S. PATENT DOCUMENTS 8,193,808 B2   6/2012  Fu et al.
9,385,654 B2   7/2016  Englund et al.
(Continued)

OTHER PUBLICATIONS

"Nitrogen-Vacancy Center", Available online at: https://en.wikipedia.org/wiki/Nitrogen-vacancy_center, Apr. 12, 2016, 13 pages.
(Continued)

*Primary Examiner* — Mark R Gaworecki
(74) *Attorney, Agent, or Firm* — Kilpatrick Townsend & Stockton LLP

(57) ABSTRACT

A system and method for making measurements inside a wellbore makes use of a diamond crystal with a nitrogen vacancy center (NV-center) to sense temperature, pressure, magnetic fields, strain, electric fields, or other parameters of the downhole environment. The system includes a microwave source that can be positioned to produce microwaves inside the wellbore and a light source that can be positioned to produce interrogation light inside the wellbore. The NV-center of the diamond is struck by the interrogation light. A spectrometer can be adapted to receive the excitation light output from the NV-center and produce a spectrum of the excitation light. The spectrum is indicative of the value of the parameter inside the wellbore.

17 Claims, 7 Drawing Sheets

(56) References Cited

U.S. PATENT DOCUMENTS

2014/0167759 A1   6/2014   Pines et al.
2014/0197831 A1   7/2014   Walsworth
2015/0374250 A1   12/2015  Hatano et al.
2016/0334474 A1   11/2016  Hatano et al.
2016/0356863 A1   12/2016  Boesch et al.

OTHER PUBLICATIONS

Clevenson et al., "Broadband Magnetometry and Temperature Sensing with a Light-Trapping Diamond Waveguide", Nature Physics, vol. 11, No. 5, Apr. 6, 2015, pp. 393-397.
Dolde et al., "Electric-Field Sensing using Single Diamond Spins", Nature Physics, vol. 7, No. 6, Jun. 2011, pp. 459-463.
Kucsko et al., "Nanometre-Scale Thermometry in a Living Cell", Nature, vol. 500, Aug. 1, 2013, pp. 54-58.
Maze et al., "Nanoscale Magnetic Sensing with an Individual Electronic Spin in Diamond", Nature, vol. 455, Available online at: https://zumbuhllab.unibas.ch/pdf/talks/0910821_Sarah_DiamondNV_BSensor.pdf, Oct. 2, 2008, pp. 644-647.
International Patent Application No. PCT/US2017/068926, International Search Report and Written Opinion, dated Sep. 21, 2018, 16 pages.

NITROGEN-VACANCY-BASED DOWNHOLE SENSING

TECHNICAL FIELD

The present disclosure relates generally to devices for use in wells. More specifically, but not by way of limitation, this disclosure relates to downhole sensors for measuring parameters inside a wellbore, for example, temperature, pressure, strain, electrical fields, and magnetic fields.

BACKGROUND

In drilling wells for oil and gas exploration, understanding the structure and properties of the associated geological formation provides information to aid such exploration. The physical conditions inside the wellbore can be monitored to ensure proper operation of the well. A wellbore is a challenging environment, with temperatures that can approach 150 degrees C. (302 degrees F.), 175 degrees C. (347 degrees F.), or even 200 degrees C. (392 degrees F.), and pressures that can approach 25 kpsi (172 MPa, or about 1700 atmospheres), or even 30 kpsi (207 MPa, or about 2000 atmospheres). There is ongoing effort to develop systems and methods that can allow for more flexibility without significant loss of precision in systems and techniques to measure parameters downhole at a drilling site.

DETAILED DESCRIPTION

Figure 1:
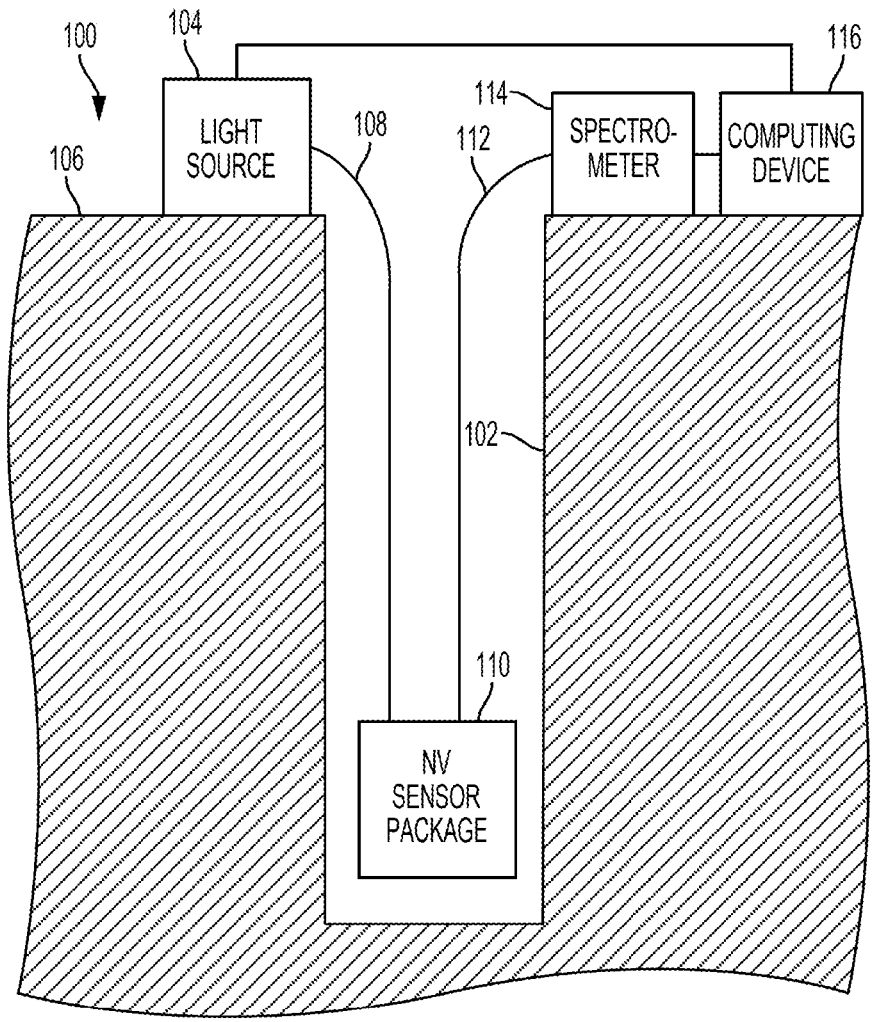
FIG. 1 is a schematic view of an example well that includes a system for making measurements in a wellbore according to some aspects.

Certain aspects and features of the present disclosure relate to making measurements in a wellbore using a diamond crystal with a nitrogen vacancy center (NV-center). The NV-center can be used to sense temperature, pressure, magnetic fields, strain, electrical fields, or other parameters of the environment inside the wellbore. An NV-center is a point defect in a diamond crystal, where one carbon atom has been replaced by a nitrogen atom, and at one of the nearest neighbor positions to the nitrogen atom, a carbon atom is missing, leaving behind a vacancy.

A system for making measurements using a diamond with an NV-center as a sensor can include a microwave source that can be positioned to produce microwaves inside a wellbore and a light source that can be positioned to produce interrogation light inside the wellbore. In operation, the diamond can be placed inside the wellbore and is bombarded by microwaves to transfer electrons among ground state sublevels. The NV-center of the diamond can be struck by the interrogation light. The NV-center of the diamond produces excitation light that is detectable for indicating a value of a parameter inside the wellbore. In some aspects, a spectrometer can be adapted to receive the excitation light output from the NV-center and produce a spectrum of the excitation light. The spectrum can be indicative of the value of the parameter inside the wellbore and can be correlated with the value of the parameter so the value can be displayed or stored, for example, by a computing device.

The use of a diamond as a sensor in some examples may result in a number of benefits. Since the sensing is done at the atomic scale, a very small diamond, typically a nano-diamond, can be used. Thus, high spatial resolution can be achieved. The NV-center has high sensitivity compared to other types of sensors, especially for magnetic fields. Multiple diamonds or diamonds with multiple NV-centers can be used to provide a scalable sensor. The sensor does not drift over time or require recalibration since a diamond crystal survives many years without its properties changing. This stability enables such a sensor to be installed for permanent monitoring, for example, by embedding the sensor in cement. Light sources and detectors can be designed to interact with the sensor through optical fiber cables, which are not subject to electromagnetic interference.

Many different parameters of the environment inside the wellbore affect the NV-center in ways that can be measured. As examples, temperature, electric fields, magnetic fields, pressure, and strain can each perturb the zero-field energy splitting of the ground state magnetic sublevels in an NV-center, albeit with different strengths. This characteristic can be exploited to create NV-center-based sensors that can offer high measurement spatial resolution and sensitivity in a chemically inert package, which can function over a wide range of temperatures.

In certain aspects, the measurement of a parameter (e.g., temperature or electric field) is achieved by exposing the sensor to the environment of choice and accurately measuring the induced energy shift in the ground state via optical excitation and detection. A microwave field is used to transfer the internal electronic population among the ground state sublevels ("state preparation"), and coherent light, generated for example by a pump laser at 532 nm strikes the NV-center and produces excitation light with a spectrum that "counts" how much of the population is in each sublevel ("excitation and detection"). A bias level value of the parameter being measured, especially for strain, magnetic fields, or electric fields can help "separate" the sublevels so that they are distinguishable during state detection to improve resolution and accuracy. Multiple parameters have also been measured with the same NV center system at the same time. Bias fields aligned along specific diamond crystal orientations can also help differentiate between, for example, a magnetic and an electric field during a measurement.

Throughout this disclosure, the term "interrogation light" refers to light incident on the NV-center during the measurement process. This light can also be referred to as "coherent light" with an "interrogation wavelength" and the striking of the NV-center with incident coherent light can be referred to as "interrogating" the NV-center or "interrogating" the sensor. Excitation light can include light returned from the NV-center that is analyzed to determine a parameter value. Laser light can be light generated by a laser. Laser light in some examples includes interrogation light, but in some examples can also or instead refer to light used for other purposes in a measurement system.

Illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative aspects but, like the illustrative aspects, should not be used to limit the present disclosure.

FIG. 1 schematically illustrates a system 100 for making measurements in a wellbore 102. A light source 104 located at the surface 106 sends laser light downhole into the wellbore 102 through a first optical fiber 108, and this laser light strikes an NV-center in a diamond crystal within the NV sensor package 110. NV sensor package 110 in some aspects includes the diamond crystal as well as a microwave source and other hardware, optional or necessary, to obtain parameter measurements and will be discussed in further detail below. Light that is detectable for indicating a value of a parameter inside the wellbore is emitted from the NV-center. The light which is emitted by the NV-center within the NV sensor package 110 is sent back to the surface through a second optical fiber 112 to a spectrometer 114. Spectrometer 114 receives the excitation light and can produce a spectrum indicative of the value of a parameter within the wellbore 102. Spectrometer 114 is connected to a computing device 116, which correlates the spectrum with a parameter value or in some aspects multiple parameter values and stores or outputs the value(s). In the example system 100 of FIG. 1, computing device 116 at surface 106 also controls light source 104. Spectrometer 114 can in some examples be combined with computing device 116.

The NV sensor package 110 can, as an example, be coupled to a wireline, slickline, or coiled tube (e.g., wired or unwired) that can be deployed into the wellbore 102. The wireline, slickline, or coiled tube can be guided into the wellbore 102 using, for example, a guide or winch. In some examples, the wireline, slickline, or coiled tube can be wound around a reel. In some aspects, the NV sensor package 110 can move through the well system and collect data regarding a physical parameter, for example, magnetic field intensity. As another example, the NV sensor package 110 can deployed behind a casing. The NV sensor package 110 can also be deployed with production tubing being used during well operations.

Figure 2:
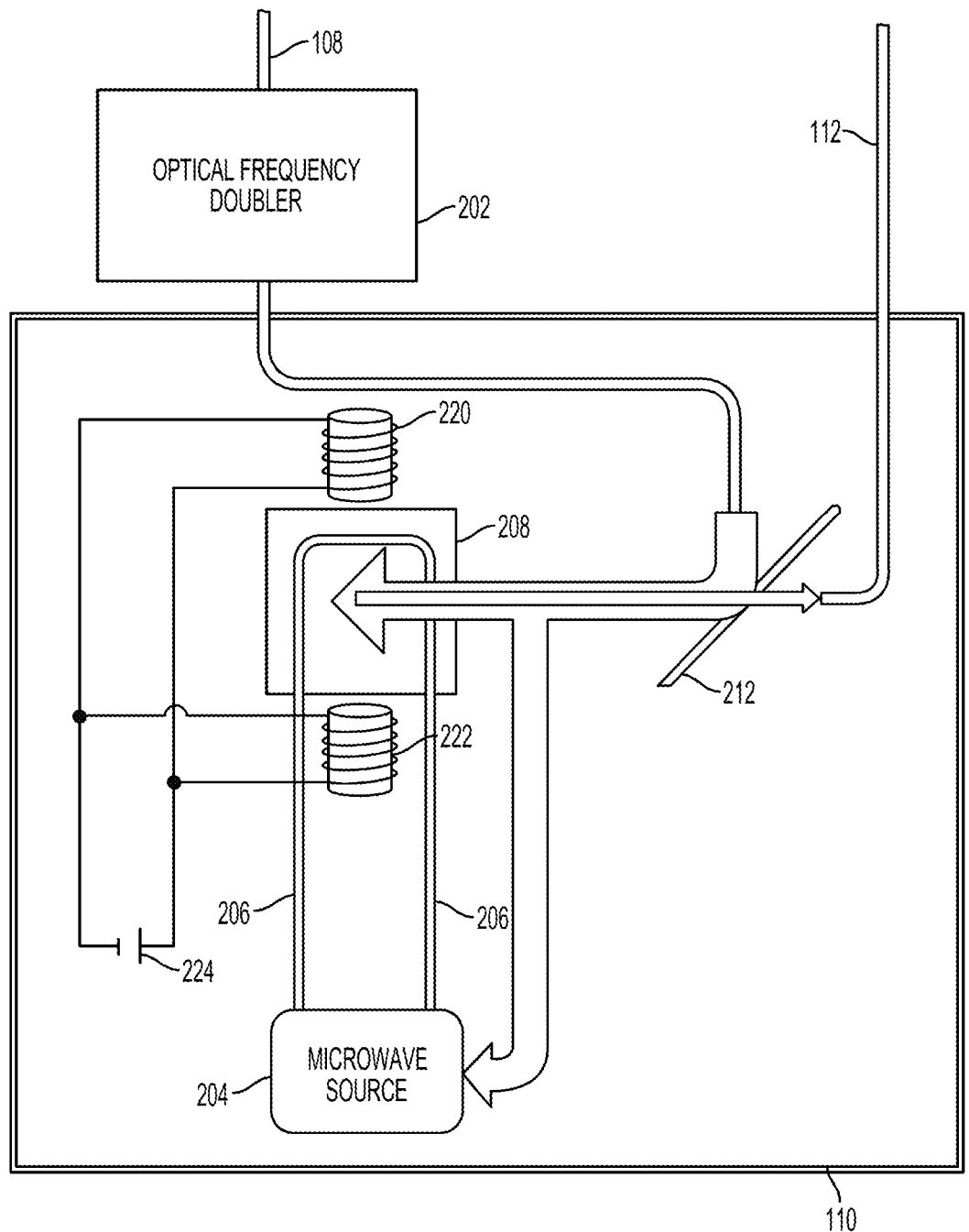
FIG. 2 is a schematic diagram of an example sensor package for making measurements in a wellbore according to some aspects.

FIG. 2 is a schematic diagram of NV sensor package 110 according to some aspects. In this particular example, it can be assumed the parameter being measured is magnetic field. Optical fiber 108 sends light downhole to the NV sensor package as discussed above. It should be noted, that the laser light sent down optical fiber 108 by light source 104 of FIG. 1 can be interrogation light that is sent directly to NV sensor package 110. Alternatively, to overcome the higher loss with shorter wavelengths (higher frequencies) that optical fibers exhibit, optical frequency doubler 202 can be connected between the light source 104 and NV sensor package 110 so that light with half the required frequency can be sent downhole with less loss. The frequency doubler 202 then converts the laser light to coherent light with the interrogation wavelength required.

Still referring to FIG. 2, NV sensor package 110 includes a microwave source 204 and a transmission line 206, which carries microwaves and bombards diamond 208 with the microwaves to excite the NV-center(s) in the crystalline structure of the diamond. Short-wavelength, coherent, interrogation light (indicated by the thicker arrows) is sent into NV sensor package 110 and is incident on the NV-center of diamond 208, and longer-wavelength excitation light (indicated by the thinner arrow) is emitted by the NV-center(s) in the diamond. This longer-wavelength excitation light is sent back to the surface through optical fiber 112, and can be spectroscopically analyzed as discussed above. A dichroic mirror 212 optically coupled to the incoming and outgoing optical fibers reflects short-wavelength light and transmits longer-wavelength light. The interrogation light has a shorter wavelength than any of the frequencies in the spectrum of the excitation light.

NV sensor package 110 of FIGS. 1 and 2 also includes an optional biasing device. The biasing device includes electromagnets 220 and 222, as well as power supply 224. In some examples, power supply 224 can be a rechargeable or removable battery. However, power supply 224 can alternatively be a connection to a power cable run downhole from the surface. The biasing device can create a bias value of magnetic field around diamond 208. The bias level of the sensed parameter helps further separate sublevels within the NV-center so that they are distinguishable during state detection. The type of biasing device chosen would necessarily depend on the parameter being measured. For example, a biasing device for temperature might be a heating or cooling device depending on the expected ambient range.

In FIG. 2, microwave source 204 is illustrated as receiving some of the coherent laser light from dichroic mirror 212. In some aspects, microwave source 204 includes an electro-optomechanical converter that receives this laser light and converts the laser light to microwaves. The electro-optomechanical converter produces microwaves in response to optical photons. The electro-optomechanical converter can be a resonant optical, microwave, and mechanical system which contains an optomechanical crystal such as an aluminum nitride (AlN) crystal, which may be piezoelectric. Other types of optomechanical crystals may be used. The electro-optomechanical device provides a nanomechanical interface between optical photons and microwave electrical signals to achieve signal transfer by parametric electro-optical coupling using a localized phonon mode. The crystal may be monolithically integrated on an integrated circuit chip.

In other aspects, an NV sensor package 110 of FIG. 2 can receive microwaves from a microwave source at the surface 106 of FIG. 1. In such an embodiment, the microwaves can be delivered downhole to the NV-center sensor via a waveguide or transmission line in much the same way that light in FIG. 1 is delivered to and received from the wellbore by optical waveguides (fibers). In either case, the microwave source is positionable to produce microwaves inside the wellbore.

Figure 3:
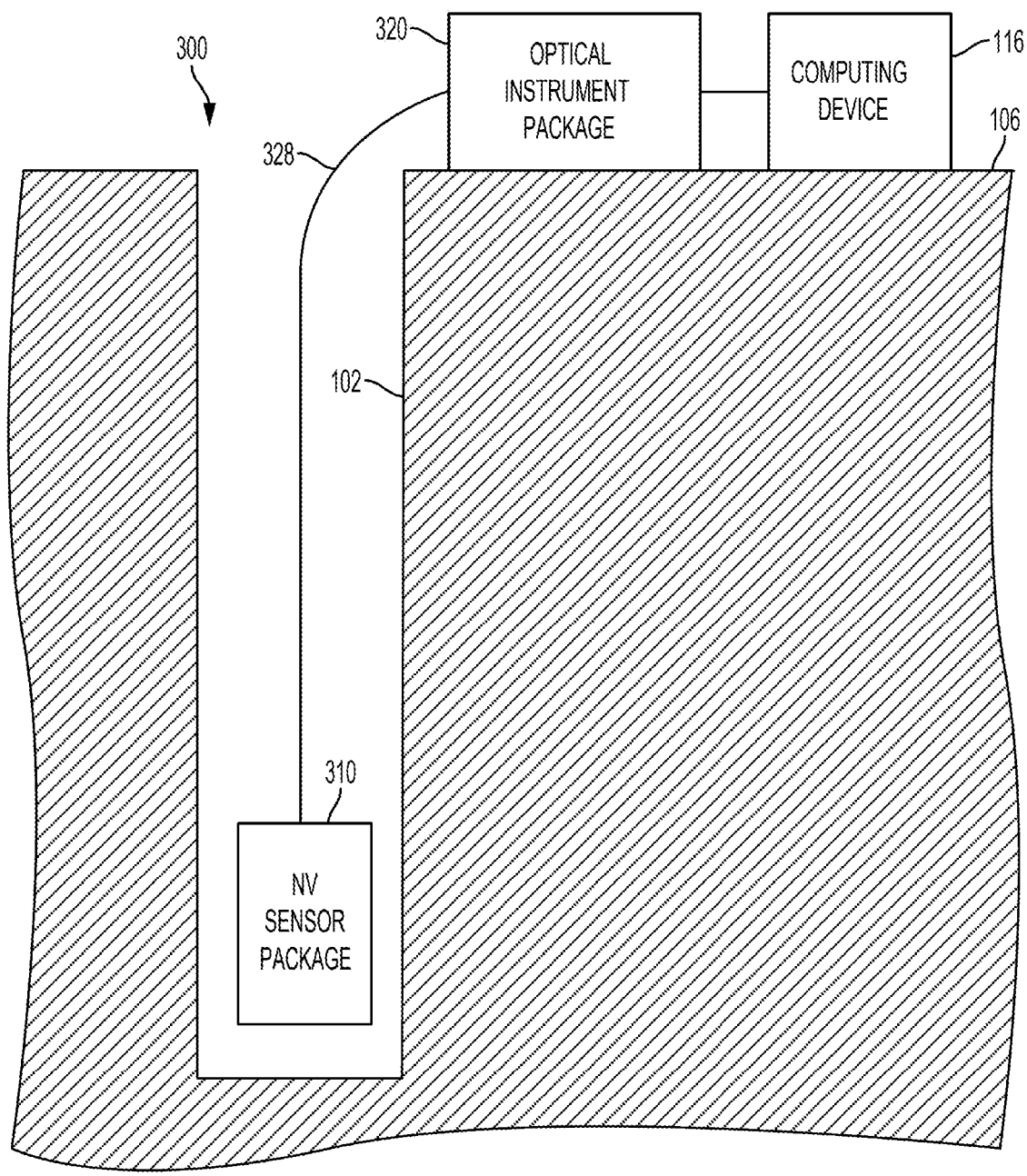
FIG. 3 is a schematic cross-sectional view of another example of a well that includes a system for making measurements in a wellbore according to some aspects.

FIG. 3 schematically illustrates another example system 300 for making measurements in the wellbore 102 using NV sensor package 310. System 300 operates by sending interrogation light and receiving excitation light through the same optical fiber. In system 300, a light source and spectrometer are both included in optical instrument package 320 located at the surface 106. The light source in optical instrument package 320 sends laser light downhole into the wellbore 102 through an optical fiber 328, and this laser light strikes an NV-center in a diamond crystal within the NV sensor package 310. NV sensor package 310 in some examples includes the diamond crystal as well as a microwave source and other hardware, optional or necessary, to obtain parameter measurements. The light which is emitted by the NV-center within the NV sensor package 310 is sent back to the surface through optical fiber 328 to a spectrometer in optical instrument package 320. In this example, the optical instrument package may include a dichroic mirror and other optics as necessary to manage the bidirectional flow of light.

Still referring to FIG. 3, the spectrometer in optical instrument package 320 receives the excitation light and produces a spectrum indicative of the value of a parameter within the wellbore 102. Optical instrument package 320 is connected to computing device 116, which correlates the spectrum with a parameter value or in some examples multiple parameter values and stores or outputs the value(s). In the example system 300 of FIG. 3, computing device 116 at the surface 106 can also control the light source and may control other optical components in optical instrument package 320. Optical instrument package 320 can in some examples be combined with computing device 116.

Figure 4:
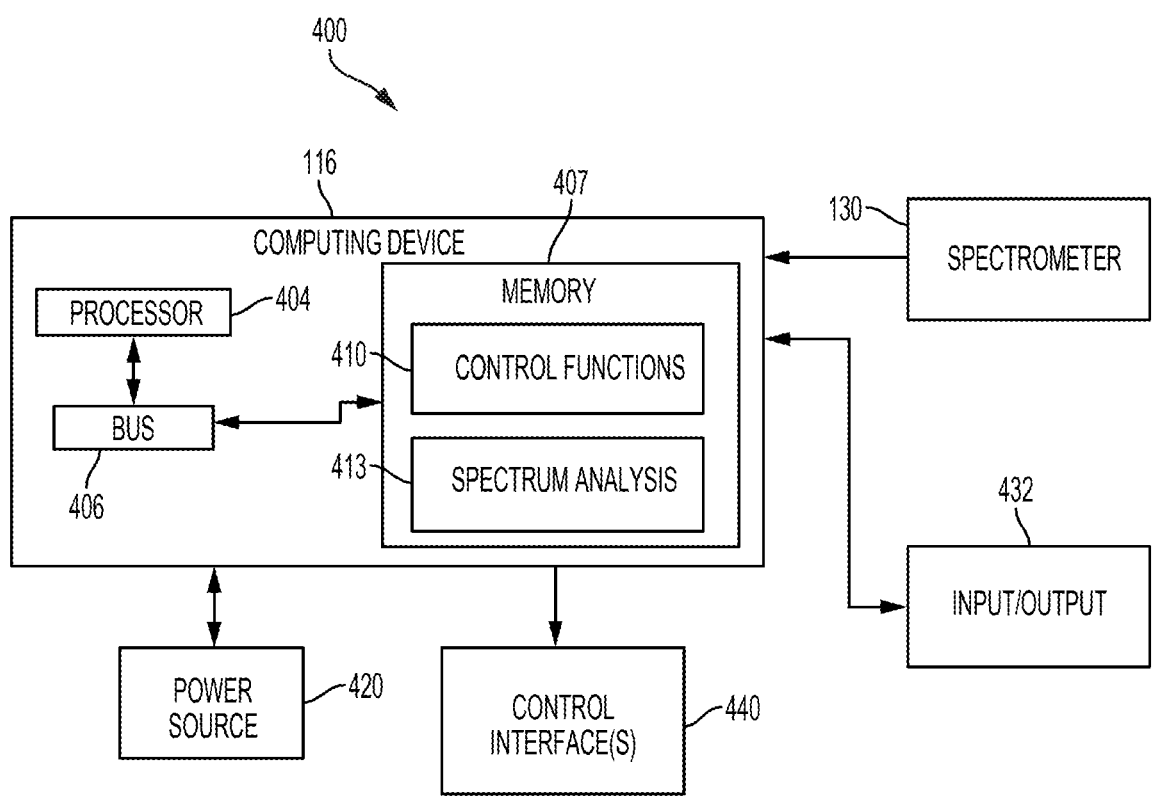
FIG. 4 is a schematic block diagram of an example of a computing device used for making measurements in a wellbore according to some aspects.

FIG. 4 is a block diagram of an example of a system 400 for making measurements in a wellbore using an NV sensor according to some examples. In some examples, the components shown in FIG. 4 (e.g., the computing device 116 and power source 420) can be integrated into a single structure. For example, the components can be within a single housing. In other examples, the components shown in FIG. 4 can be distributed (e.g., in separate housings) and in electrical communication with each other.

The system 400 includes a computing device 116. The computing device 116 can include a processor 404, a memory 407, and a bus 406. The processor 404 can execute one or more operations for obtaining measurements in the wellbore and controlling various devices to enable the measurements. The processor 404 can execute instructions stored in the memory 407 to perform the operations. The processor 404 can include one processing device or multiple processing devices. Non-limiting examples of the processor 404 include a Field-Programmable Gate Array ("FPGA"), an application-specific integrated circuit ("ASIC"), a microprocessor, etc.

The processor 404 can be communicatively coupled to the memory 407 via the bus 406. The non-volatile memory 407 may include any type of memory device that retains stored information when powered off. Non-limiting examples of the memory 407 include electrically erasable and programmable read-only memory ("EEPROM"), flash memory, or any other type of non-volatile memory. In some examples, at least some of the memory 407 can include a non-transitory medium from which the processor 404 can read instructions. A non-transitory computer-readable medium can include electronic, optical, magnetic, or other storage devices capable of providing the processor 404 with computer-readable instructions or other program code. Non-limiting examples of a computer-readable medium include (but are not limited to) magnetic disk(s), memory chip(s), ROM, random-access memory ("RAM"), an ASIC, a configured processor, optical storage, or any other medium from which a computer processor can read instructions. The instructions can include processor-specific instructions generated by a compiler or an interpreter from code written in any suitable computer-programming language, including, for example, C, C++, C#, etc.

In some examples, the memory 407 can include computer program instructions 410 for providing control functions to operate a microwave source, a biasing device, and light sources as needed. The memory can also include computer program instructions 413 for spectrum analysis to correlate a spectrum of wavelengths of light received from spectrometer 130 with a value of a parameter or parameters inside the wellbore. Computer program instructions 410 can operate the light source, microwave source, and bias device through the control interface(s) 440.

The system 400 can include a power source 420. The power source 420 can be in electrical communication with the computing device 116. In some examples, the power source 420 can include a battery or an electrical cable (e.g., a wireline). In some examples, the power source 420 can include an AC signal generator. System 400 receives input from spectrometer 130, which was shown FIG. 1. System 400 in this example also includes input/output interface 432. Input/output interface 432 can connect to a keyboard, pointing device, display, and other computer input/output devices. An operator may provide input using the input/output interface 432. A value or values for downhole parameters may also be output through input/output interface 432. All or portions of input/output interface 432 may be located either locally or remotely relative to the rest of system 400. It should also be noted that any connections shown between a computing device and other instruments or hardware throughout this disclosure can be made wirelessly. System components and sensors can also be located remotely from each other and connected through a direct or networked interface. Such a networked interface can include the Internet.

Figure 5:
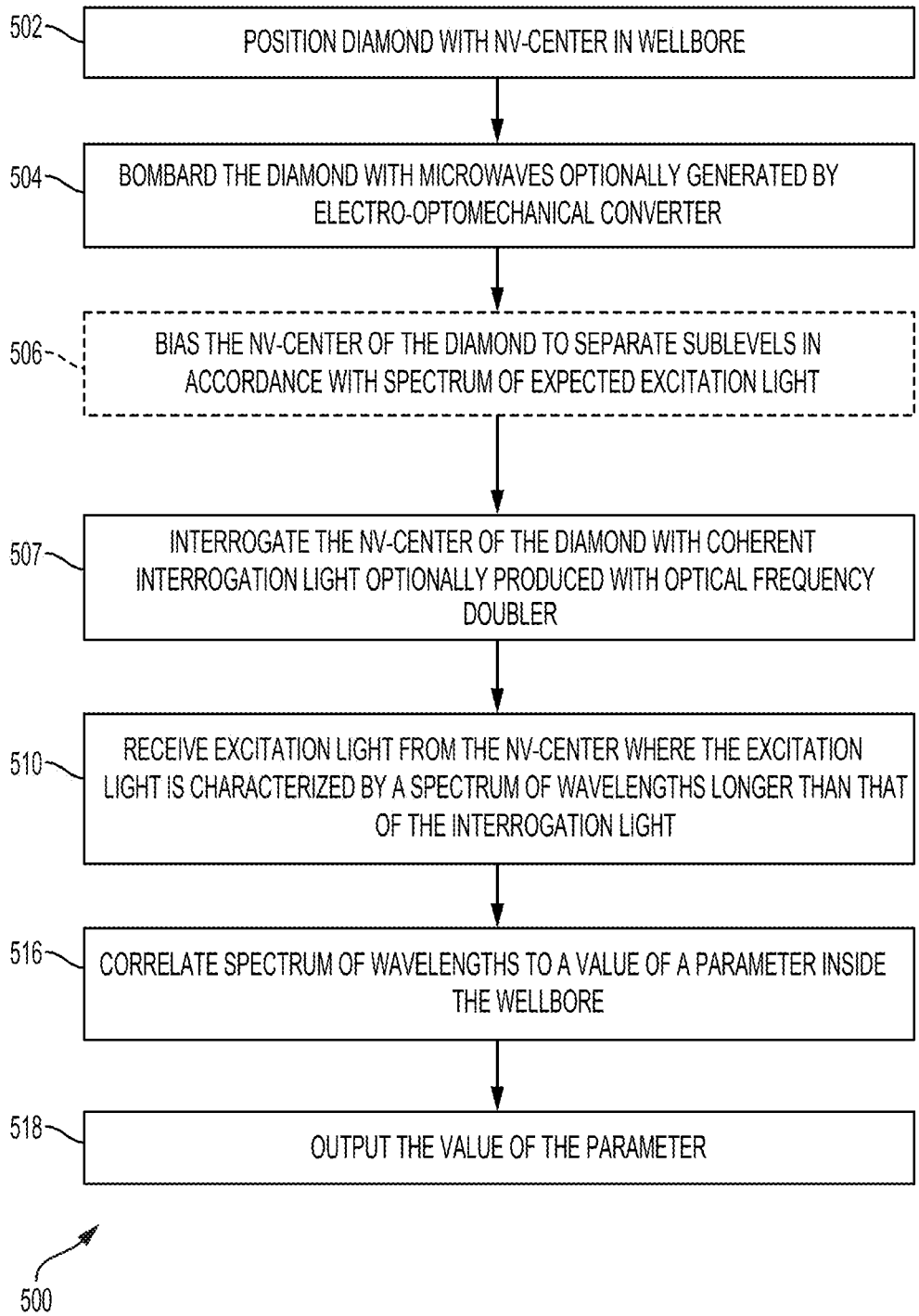
FIG. 5 is a flowchart of a method of obtaining a measurement of a parameter in a wellbore according to some aspects.

FIG. 5 is an example of a flowchart of a process 500 for making measurements in a wellbore using an NV sensor according to some examples. Some examples can include more, fewer, or different blocks than those shown in FIG. 5. Some or all of the blocks shown in FIG. 5 can be implemented using the computing device illustrated in FIG. 1, FIG. 2, and FIG. 4.

At block 502 of FIG. 5, a diamond with an NV-center is positioned in a wellbore. The diamond can be placed as part of a sensor package in advance, or right before measurements are taken, and can be placed by being attached to a tool string or independently. Computing device 116 can control the positioning of a sensor package or a tool string to place the diamond. At block 504, the diamond is bombarded with microwaves. The microwaves can optionally be generated by converting laser light into microwaves using the electro-optomechanical converter previously discussed. If necessary to further separate sublevels for the expected spectrum of excitation light, a biasing device can be activated to bias the NV-center with a bias value of the parameter to be measured at block 506. At block 507, the NV-center of the diamond is interrogated with coherent light having an interrogation wavelength. The interrogation of the NV-center can be accomplished by computing device 116 activating a pump laser, optionally using a frequency doubler as previously discussed.

Still referring to FIG. 5, at block 510 excitation light is received from the NV-center. The excitation light is characterized by a spectrum of wavelengths, each of the wavelengths in the spectrum of wavelengths being longer than the interrogation wavelength. At block 516, the spectrum is correlated to a value of a parameter inside the wellbore, and at block 518, the value is output, for example by displaying it to an operator or saving it on a storage device. The entire process 500, or portions thereof can be repeated and values stored to create a log of values over time. The value(s) can optionally be transmitted over a wired or wireless computer network.

Figure 6:
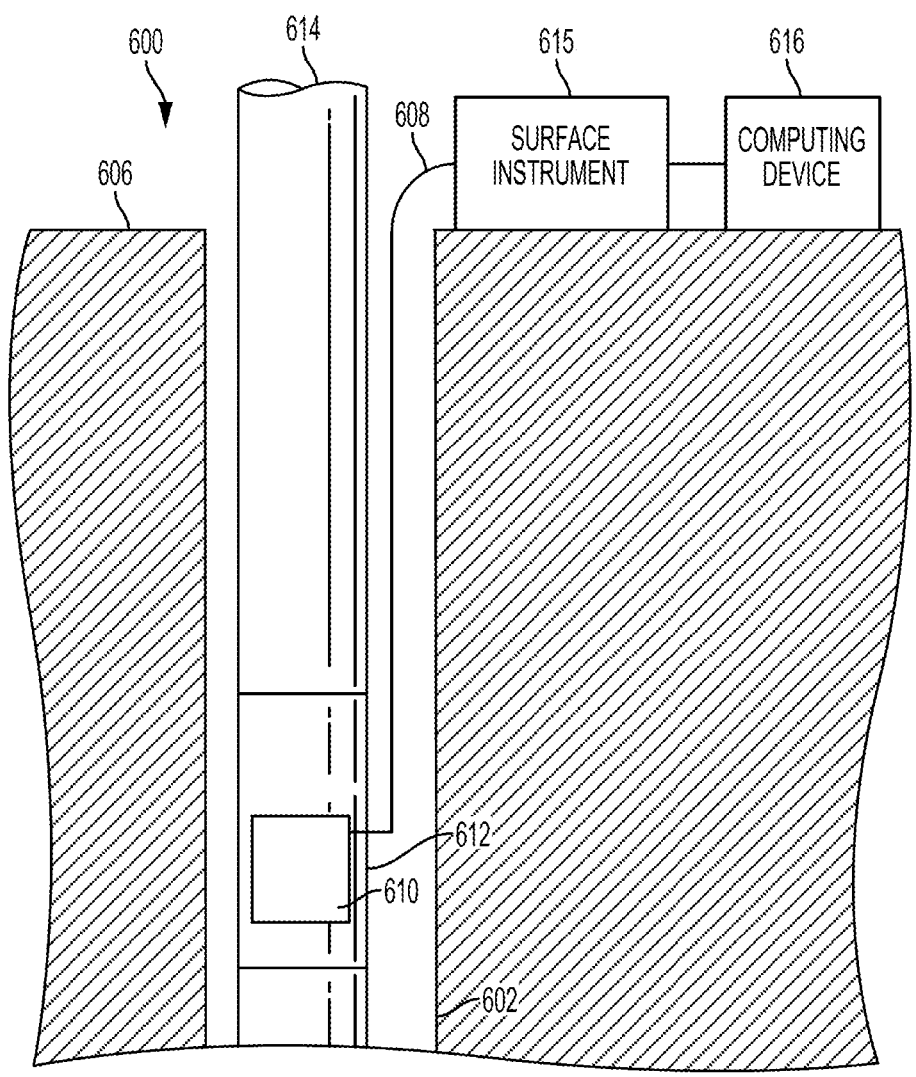
FIG. 6 is a schematic view of an additional example well that includes a system for making measurements in a wellbore according to some aspects.

FIG. 6 schematically illustrates another example system 600 for making measurements in a wellbore 602 using an NV sensor package 610. System 600 illustrates multiple alternative aspects of a measurement system being used together; however, these aspects can be implemented independently. In system 600, a light source and spectrometer are both included in NV sensor package 610 located downhole. NV sensor package 610 receives power and returns values encoded as electrical signals through cable 608 to the surface 606. The microwave source and any biasing device needed can also be included in NV sensor package 610 so that much of the sensor hardware is in a self-contained device. The coherent light, the microwaves and the value of the relevant parameter can all be produced downhole and the parameter value is transmitted to a surface instrument 615, which decodes an electrical signal indicative of the parameter value received through cable 608.

In some examples, the NV sensor package 620 of FIG. 6 may also include a microcontroller to control the various hardware components, correlate the spectrum light produced by the NV-center of a diamond to a parameter value, and output the value through electrical cable 608. Thus, with system 600 many of the blocks shown in FIG. 5 can be executed downhole. Surface instrument 615 may display or record parameter values, and may also include a microcontroller to manage these functions. Surface instrument 615 can be self-contained in the sense that it is not connected to a computer, or alternatively, have an interface to optionally connect to computing device 616. Either the surface instrument 615 or the computing device 616 can control NV sensor package 610 through signals sent through cable 608. It should also be noted that a wireless connection can be used in place of electrical cable 608 for signaling, with power being supplied to the NV sensor package 610 by a self-contained power source such as a battery, or by a dedicated power cable. Signaling can also be accomplished through a fiber optic cable. Surface instrument 615 can in some examples be combined with computing device 616.

Still referring to FIG. 6, in another aspect the NV sensor package 610 and hence the diamond with an NV-center are attached to a wellbore tool 612, which is part of a tool string 614. Wellbore tool 612 can serve a purpose independent of making measurements downhole using the NV-center sensor, or it can be a wellbore tool dedicated to such measurements, or a combination wellbore tool. The term "attached" as used with respect to the NV sensor package 610 includes being a part of or embedded in the wellbore tool. Note that where an NV-center sensor is attached to a wellbore tool, light can be sent and received over optical fibers that are connected to the wellbore tool and the NV sensor package 610 can be configured as shown in and discussed with respect to FIG. 2. A cable associated with the wellbore tool can also be used for communication or power for the NV-center sensor and associated components. It should be noted that when a microwave source, a spectrometer, a biasing device, or any other component of a sensor system is referred to herein as being "positionable" or "positioned" to produce microwaves or light, or to receive light, the term is meant to encompass both downhole and surface positioning of such devices as long as appropriate connections or proximity is maintained to make an NV-center sensor work as described for providing sensing or measurement functions.

Figure 7:
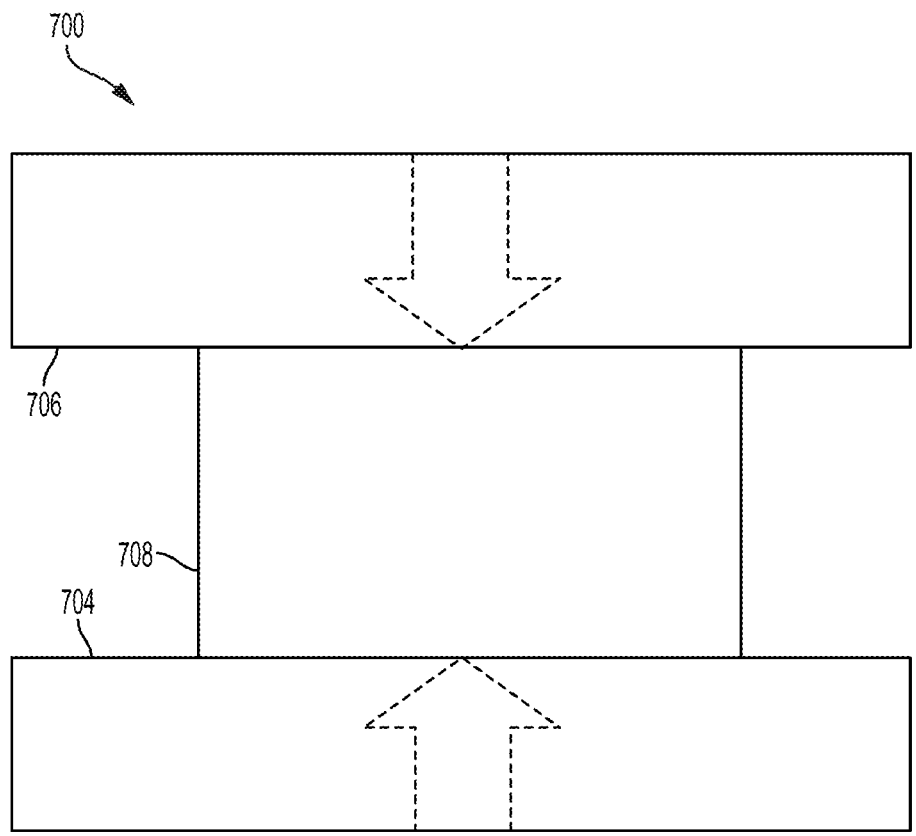
FIG. 7 is a schematic view of a sensor that can be used for making measurements in a wellbore according to some aspects.
Figure 8:
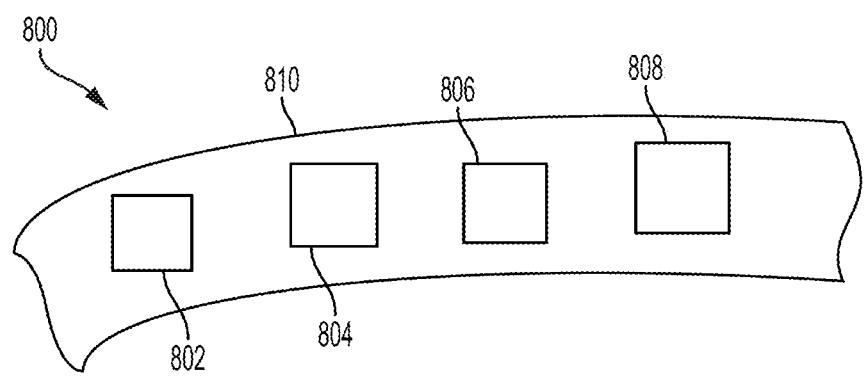
FIG. 8 is a schematic view of a sensor that can be used for making measurements in a wellbore according to some aspects.

FIGS. 7 and 8 are schematic representations of examples of how a diamond with an NV-center used inside a wellbore can be used to sense mechanical parameters. The sensors shown in FIGS. 7 and 8 can for example be employed with sensor package 610. In FIG. 7, NV sensor 700 includes two plates, 704 and 706, with nanodiamond 708 fixed in between the plates. Nanodiamond 708 includes an NV-center. Sensor 700 can be used to sense pressure, as increasing pressure will tend to compress plates 704 and 706 in the direction of the dotted arrows, resulting in a corresponding mechanical stress on the diamond. This stress affects the energy levels of the NV-center, and can be correlated with the spectrum of excitation light from the NV-center.

FIG. 8 shows an example NV sensor 800 including multiple nanodiamonds 802, 804, 806, and 808, each with an NV-center (not shown). Sensor 800 can be used to measure mechanical strain. The nanodiamonds are mounted on or embedded in a flexible cantilever 810. Mechanical strain causes the cantilever 810 to bend, which in turn affects the energy levels of the NV centers. The spectrums of the excitation light from the NV-centers can be correlated with the mechanical strain of the cantilever. If the cantilever is allowed to move around freely, this mechanical coupling between the individual NV-centers and the cantilever increases, and the strain sensor has increased sensitivity.

In some aspects, systems and methods for making measurements in a wellbore are provided according to one or more of the following examples:

As used below, any reference to a series of examples is to be understood as a reference to each of those examples disjunctively (e.g., "Examples 1-4" is to be understood as "Examples 1, 2, 3, or 4").

Example #1

A system for making measurements in a wellbore, the system including a microwave source positionable to produce microwaves inside a wellbore, a light source positionable to produce interrogation light inside the wellbore, and a diamond including a nitrogen vacancy center (NV-center), the diamond being positionable in the wellbore to receive the microwaves and the interrogation light so that the NV-center produces excitation light that is detectable for indicating a value of a parameter inside the wellbore.

Example #2

The system of example 1 further comprising a biasing device positionable to create a bias level of the parameter at the NV-center.

Example #3

The system of example(s) 1 or 2 wherein the microwave source comprises an electro-optomechanical converter.

Example #4

The system of example(s) 1-3 wherein the diamond is attached to a wellbore tool.

Example #5

The system of example(s) 1-4 further including a spectrometer adapted to receive the excitation light from inside the wellbore and produce a spectrum of the excitation light, the spectrum indicative of a value of a parameter inside the wellbore.

Example #6

The system of example(s) 1-5 further including a dichroic mirror optically coupled to the NV-center, a first optical fiber coupled to the light source and the dichroic mirror, and a second optical fiber coupled to the spectrometer and the dichroic mirror.

Example #7

The system of example(s) 1-6 further including an optical fiber connected to the light source, and an optical frequency doubler connected between the optical fiber and the NV-center.

Example #8

A measurement method includes positioning a diamond including a nitrogen vacancy center (NV-center) in a wellbore, bombarding the diamond with microwaves, interrogating the NV-center of the diamond with coherent light having an interrogation wavelength, receiving excitation light from the NV-center, wherein the excitation light is characterized by a spectrum of wavelengths, each wavelength in the spectrum of wavelengths being longer than the interrogation wavelength, correlating the spectrum of wavelengths to a value of a parameter inside the wellbore, and outputting the value of the parameter.

Example #9

The method of example 8 further including biasing the NV-center with a bias value of the parameter.

Example #10

The method of example(s) 8 or 9 wherein the interrogating of the NV-center of the diamond includes sending laser light into the wellbore through an optical fiber, and passing the laser light through an optical frequency doubler to produce the coherent light having the interrogation wavelength.

Example #11

The method of example(s) 8-10 wherein the receiving of the excitation light from the NV-center includes receiving the excitation light through the optical fiber.

Example #12

The method of example(s) 8-11 wherein interrogating the NV-center of the diamond includes introducing the coherent light into the wellbore using a first optical fiber connected to a surface instrument, and receiving the excitation light from the NV-center includes receiving the excitation light through a second optical fiber connected to the surface instrument, wherein the first optical fiber and the second optical fiber are both connected to a dichroic mirror inside the wellbore.

Example #13

The method of example(s) 8-12 wherein bombarding the diamond with microwaves includes introducing laser light into the wellbore, and converting the laser light into the microwaves inside the wellbore.

Example #14

The method of example(s) 8-13 wherein the coherent light, the microwaves and the value are all produced downhole and the method includes transmitting the value to a surface instrument from inside the wellbore.

Example #15

A system includes a microwave source positionable to produce microwaves inside a wellbore, a light source positionable to produce interrogation light inside a wellbore, a diamond including a nitrogen vacancy center (NV-center), the diamond being positionable in the wellbore to receive the microwaves and the interrogation light so that the NV-center produces excitation light, and a computing device in communication with the microwave source, the light source, and the diamond. The computing device is operable to actuate the microwave source to bombard the diamond with microwaves, actuate the light source to strike the NV-center of the diamond with the interrogation light, correlate a spectrum of wavelengths in the excitation light produced by the NV-center to a value of a parameter inside the wellbore, and output the value.

Example #16

The system of example 15 wherein the diamond is attached to a wellbore tool and the computing device is further operable to control the wellbore tool.

Example #17

The system of example(s) 15 or 16 further including a spectrometer connected to the computing device to produce the spectrum of wavelengths.

Example #18

The system of example(s) 15-17 further including a biasing device connected to the computing device and wherein the computing device is operable to bias the NV-center with a bias value of the parameter.

Example #19

The system of example(s) 15-18 wherein the parameter includes a magnetic field intensity and the biasing device includes an electromagnet.

Example #20

The system of example(s) 15-19 wherein the diamond is attached to a cantilever and the parameter includes mechanical strain.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

What is claimed is:

1. A system for making measurements in a wellbore, the system comprising:
a microwave source positionable to produce microwaves inside a wellbore;
a light source positionable to produce interrogation light inside the wellbore;
a diamond including a nitrogen vacancy center (NV-center), the diamond being positionable in the wellbore to receive the microwaves and the interrogation light so that the NV-center produces excitation light that is detectable for indicating a value of a parameter inside the wellbore; and
a spectrometer adapted to receive the excitation light from inside the wellbore and produce a spectrum of the excitation light, the spectrum indicative of a value of a parameter inside the wellbore.

2. The system of claim 1 further comprising a biasing device positionable to create a bias level of the parameter at the NV-center.

3. The system of claim 1 wherein the microwave source comprises an electro-optomechanical converter.

4. The system of claim 1 wherein the diamond is attached to a wellbore tool.

5. The system of claim 1 further comprising:
a dichroic mirror optically coupled to the NV-center;
a first optical fiber coupled to the light source and the dichroic mirror; and
a second optical fiber coupled to the spectrometer and the dichroic mirror.

6. The system of claim 1 further comprising:
an optical fiber connected to the light source; and
an optical frequency doubler connected between the optical fiber and the NV-center.

7. A measurement method comprising:
positioning a diamond including a nitrogen vacancy center (NV-center) in a wellbore;
bombarding the diamond with microwaves, further comprising:
introducing laser light into the wellbore, and
converting the laser light into the microwaves inside the wellbore;
interrogating the NV-center of the diamond with coherent light having an interrogation wavelength;
receiving excitation light from the NV-center, wherein the excitation light is characterized by a spectrum of wavelengths, each wavelength in the spectrum of wavelengths being longer than the interrogation wavelength;
correlating the spectrum of wavelengths to a value of a parameter inside the wellbore; and
outputting the value of the parameter.

8. The method of claim 7 further comprising biasing the NV-center with a bias value of the parameter.

9. The method of claim 7 wherein the interrogating of the NV-center of the diamond further comprises:
sending laser light into the wellbore through an optical fiber; and
passing the laser light through an optical frequency doubler to produce the coherent light having the interrogation wavelength.

10. The method of claim 9 wherein the receiving of the excitation light from the NV-center further comprises receiving the excitation light through the optical fiber.

11. The method of claim 7 wherein:
the interrogating of the NV-center of the diamond further comprises introducing the coherent light into the wellbore using a first optical fiber connected to a surface instrument; and
the receiving of the excitation light from the NV-center further comprises receiving the excitation light through a second optical fiber connected to the surface instrument, wherein the first optical fiber and the second optical fiber are both connected to a dichroic mirror inside the wellbore.

12. The method of claim 7 wherein the coherent light, the microwaves and the value are all produced downhole and the method further comprises transmitting the value to a surface instrument from inside the wellbore.

13. A system comprising:
a microwave source positionable to produce microwaves inside a wellbore;
a light source positionable to produce interrogation light inside a wellbore;
a diamond including a nitrogen vacancy center (NV-center), the diamond being positionable in the wellbore to receive the microwaves and the interrogation light so that the NV-center produces excitation light, wherein the diamond is attached to a wellbore tool; and
a computing device in communication with the microwave source, the light source, and the diamond, the computing device being operable to:
actuate the microwave source to bombard the diamond with microwaves;
actuate the light source to strike the NV-center of the diamond with the interrogation light;
correlate a spectrum of wavelengths in the excitation light produced by the NV-center to a value of a parameter inside the wellbore;
output the value; and
control the wellbore tool.

14. The system of claim 13 further comprising a spectrometer connected to the computing device to produce the spectrum of wavelengths.

15. The system of claim 13 further comprising a biasing device connected to the computing device and wherein the computing device is operable to bias the NV-center with a bias value of the parameter.

16. The system of claim 15 wherein the parameter comprises a magnetic field intensity and the biasing device comprises an electromagnet.

17. The system of claim 13 wherein the diamond is attached to a cantilever and the parameter comprises mechanical strain.

* * * * *